US012635397B2

(12) United States Patent
Utsumi

(10) Patent No.: US 12,635,397 B2
(45) Date of Patent: May 19, 2026

(54) LIGHT-EMITTING ELEMENT, LIGHT-EMITTING DEVICE, AND METHOD OF MANUFACTURING LIGHT-EMITTING ELEMENT

(71) Applicant: Sharp Display Technology Corporation, Kameyama City (JP)

(72) Inventor: Hisayuki Utsumi, Kameyama City (JP)

(73) Assignee: Sharp Display Technology Corporation, Kameyama City (JP)

(*) Notice: Subject to any disclaimer, the term of this patent is extended or adjusted under 35 U.S.C. 154(b) by 425 days.

(21) Appl. No.: 18/286,760

(22) PCT Filed: May 11, 2021

(86) PCT No.: PCT/JP2021/017871
§ 371 (c)(1),
(2) Date: Oct. 13, 2023

(87) PCT Pub. No.: WO2022/239107
PCT Pub. Date: Nov. 17, 2022

(65) Prior Publication Data

US 2024/0215431 A1 Jun. 27, 2024

(51) Int. Cl.

| | |
|---|---|
| *H10K 50/15* | (2023.01) |
| *H10K 50/17* | (2023.01) |
| *H10K 50/81* | (2023.01) |
| *H10K 71/12* | (2023.01) |
| *H10K 85/10* | (2023.01) |

(52) U.S. Cl.
CPC ............ *H10K 71/12* (2023.02); *H10K 50/17* (2023.02); *H10K 50/81* (2023.02); *H10K 85/111* (2023.02); *H10K 85/1135* (2023.02); *H10K 85/141* (2023.02); *H10K 50/15* (2023.02)

(58) Field of Classification Search
CPC ........ H05B 33/10; H05B 33/14; H05B 33/28; H10K 50/15; H10K 50/17; H10K 50/81; H10K 71/12; H10K 85/111; H10K 85/1135; H10K 85/141
See application file for complete search history.

(56) References Cited

U.S. PATENT DOCUMENTS

2025/0151538 A1* 5/2025 Hosaka ................ H10K 59/124

FOREIGN PATENT DOCUMENTS

JP 2008-211069 A 9/2008

* cited by examiner

*Primary Examiner* — Hoai V Pham
(74) *Attorney, Agent, or Firm* — ScienBiziP, P.C.

(57) ABSTRACT

A light-emitting element includes: an anode; a cathode; an EML therebetween; and an HIL in contact with the anode between the anode and the EML. The anode contains a metal oxide, the HIL contains PVP and PEDOT:PSS, and the HIL contains the PVP in an amount of from 0.16 parts by weight inclusive to 1.5 parts by weight exclusive per unit part by weight of the PSS.

9 Claims, 4 Drawing Sheets

| FORM RESIN LAYER ON SUPPORT SUBSTRATE | S1 |
|---|---|

| FORM BARRIER LAYER | S2 |
|---|---|

| FORM THIN FILM TRANSISTOR | S3 |
|---|---|

| FORM LIGHT-EMITTING ELEMENT LAYER | S4 |
|---|---|

| FORM SEALING LAYER | S5 |
|---|---|

| ATTACH TOP FACE FILM | S6 |
|---|---|

| DETACH SUPPORT SUBSTRATE | S7 |
|---|---|

| ATTACH BOTTOM FACE FILM | S8 |
|---|---|

| DIVIDE INTO INDIVIDUAL PIECES | S9 |
|---|---|

| DETACH TOP FACE FILM | S10 |
|---|---|

| ATTACH FUNCTIONAL FILM | S11 |
|---|---|

| MOUNT ELECTRONIC CIRCUIT BOARD | S12 |
|---|---|

PREPARE AQUEOUS PEDOT:PSS–PVP SOLUTION CONTAINING PEDOT:PSS AND PVP — S31

FORM ANODE — S21

FORM BANK — S22

APPLY AND DRY AQUEOUS PEDOT:PSS–PVP SOLUTION TO FORM HOLE INJECTION LAYER — S23

FORM HOLE TRANSPORT LAYER — S24

FORM LIGHT–EMITTING LAYER — S25

FORM ELECTRON TRANSPORT LAYER — S26

FORM CATHODE — S27

LIGHT-EMITTING ELEMENT, LIGHT-EMITTING DEVICE, AND METHOD OF MANUFACTURING LIGHT-EMITTING ELEMENT

TECHNICAL FIELD

The present disclosure relates to light-emitting elements, light emitting devices, and methods of manufacturing light-emitting elements.

BACKGROUND ART

The anode of a self-luminous type of light-emitting element is preferably made of a material that has a large work function and excellent electric conductance. Therefore, the anode material is typically, for example, a metal oxide such as ITO (tin-doped indium oxide).

In addition, hole-transportable layers such as a hole injection layer and a hole transport layer are typically provided between the anode and the light-emitting layer to transport holes from the anode to the light-emitting layer. These hole-transportable layers are preferably made of a composite of poly(3,4-ethylenedioxythiophene) and poly(4-styrene sulfonate) called “PEDOT:PSS” (see, for example, Patent Literature 1).

PEDOT:PSS exhibits excellent hole transportability and high solubility (dispersibility) in aqueous mediums because polystyrene sulfonate (PSS), which co-exists as a dopant, contains sulfonic acid groups. Therefore, a PEDOT:PSS layer can be formed by liquid-phase film formation using an aqueous PEDOT:PSS solution prepared by dissolving (dispersing) PEDOT:PSS in an aqueous medium.

CITATION LIST

Patent Literature

Patent Literature 1: Japanese Unexamined Patent Application Publication, Tokukai, No. 2008-211069

SUMMARY

Technical Problem

However, hydrophobic PEDOT is easily crystallized. Therefore, when the aqueous PEDOT:PSS solution is applied to a surface of an anode containing a metal oxide such as ITO, the binding to the anode is so unstable that the resultant layer becomes non-uniform. In addition, the metal oxide reacts with the sulfonic acid groups of the PSS, causing the metal in the metal oxide to be desorbed from the anode and diffused to the surroundings. For example, when the metal oxide is ITO, the In (indium) in the ITO is desorbed from the anode and diffused to the surroundings, which induces temporal decay of the EL properties.

Note that Patent Literature 1 discloses de-sulfonation in which at least some of the sulfonic acid groups are desorbed from a carrier transport material that contains sulfonic acid groups such as PEDOT:PSS through a hydrolysis reaction to restrain temporal decay of the properties.

However, this de-sulfonation is performed by applying, for example, PEDOT:PSS to the anode and thereafter letting the coated substrate sit inside a high-humidity, high-temperature chamber. The de-sulfonation is performed inside a chamber as described here, and it is hence impossible to use a large-sized substrate. It is therefore difficult to put it into practical use on an industrial scale. Additionally, although the method of Patent Literature 1 is capable of desorbing the sulfonic acid groups of the PSS from the surface of the PEDOT:PSS, the sulfonic acid groups are unlikely to be desorbed near the anode. Therefore, the metal oxide contained in the anode reacts with the sulfonic acid groups that remain un-desorbed near the anode, so that the metal can be desorbed from the metal oxide contained in the anode and diffused to the surroundings. It is therefore impossible to sufficiently restrain temporal decay of the EL properties.

The present disclosure, in one aspect thereof, has been made in view of these issues and has an object to provide a light-emitting element that exhibits an excellent anode-binding property, a high external quantum efficiency, and high reliability and also to provide a method of manufacturing such a light-emitting element and to provide a light-emitting device.

Solution to Problem

To address these issues, the present disclosure, in one aspect thereof, is directed to a light-emitting element including: an anode; a cathode; a light-emitting layer between the anode and the cathode; and a hole-transportable, first functional layer in contact with the anode between the anode and the light-emitting layer, wherein the anode contains a metal oxide, the first functional layer contains polyvinylpyrrolidone and a composite of poly(3,4-ethylenedioxythiophene) and poly(4-styrene sulfonate), and the first functional layer contains the polyvinylpyrrolidone in an amount of from 0.16 parts by weight inclusive to 1.5 parts by weight exclusive per unit part by weight of the poly(4-styrene sulfonate).

To address the issues, the present disclosure, in one aspect thereof, is directed to a light-emitting device including the light-emitting element of one aspect of the present disclosure.

To address the issues, the present disclosure, in one aspect thereof, is directed to a method of manufacturing a light-emitting element including: an anode; a cathode; a light-emitting layer between the anode and the cathode; and a hole-transportable, first functional layer in contact with the anode between the anode and the light-emitting layer, wherein the anode contains a metal oxide, the method including: preparing an aqueous solution obtained by mixing polyvinylpyrrolidone and a composite of poly(3,4-ethylenedioxythiophene) and poly(4-styrene sulfonate) such that the polyvinylpyrrolidone is present in an amount of from 0.16 parts by weight inclusive to 1.5 parts by weight exclusive per unit part by weight of the poly(4-styrene sulfonate); and forming the first functional layer by applying the aqueous solution onto the anode and thereafter drying the aqueous solution.

Advantageous Effects of Disclosure

The present disclosure, in one aspect thereof, can provide a light-emitting element that exhibits an excellent anode-binding property, a high external quantum efficiency, and high reliability and can also provide a method of manufacturing such a light-emitting element and provide a light-emitting device.

DESCRIPTION OF EMBODIMENTS

Embodiment 1

The following will describe an embodiment of the disclosure with reference to FIGS. 1 to 5. Note that throughout the following description, the language, "from A to B," where A and B are both numerical values, refers to "greater than or equal to A and less than or equal to B" unless otherwise mentioned.

In addition, the following will describe an example where a light-emitting device in accordance with the present embodiment is a QLED display device including quantum-dot light-emitting diodes (hereinafter, will be referred to as "QLEDs") as light-emitting elements.

Display Device

Figure 1:
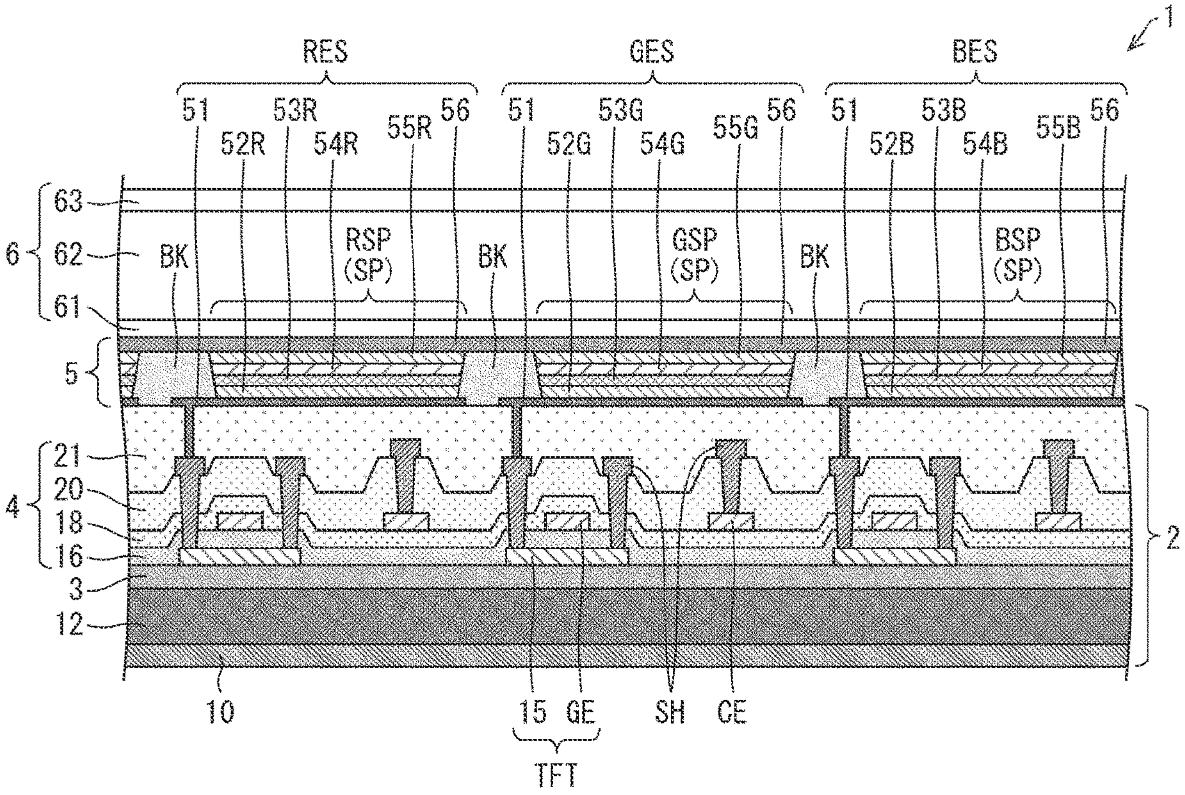
FIG. 1 is a schematic cross-sectional view of an exemplary structure of a major part of a display area of a display device in accordance with Embodiment 1.

FIG. 1 is a schematic cross-sectional view of an exemplary structure of a major part of a display area of a display device 1 in accordance with the present embodiment.

The display device 1 has a display area including a plurality of subpixels SP shown in FIG. 1 and a frame area (not shown) provided around the display area so as to surround the display area. The frame area is a non-display area. In the frame area is there provided a terminal portion (not shown) where signals are inputted for driving the subpixels SP.

The display device 1 includes, as shown in FIG. 1, an array substrate 2, a light-emitting element layer 5 stacked on the array substrate 2, and a sealing layer 6 covering the light-emitting element layer 5.

The array substrate 2 includes, for example, a bottom face film 10, a resin layer 12, a barrier layer 3, and a thin film transistor layer (hereinafter, will be referred to as a "TFT layer") 4 as a drive element layer.

The bottom face film 10 is for example, a PET (polyethylene terephthalate) film that is attached to the bottom face of the resin layer 12 after a support substrate (e.g., mother glass) is detached, to provide a highly flexible display device. Note that, for example, a solid substrate such as a glass substrate may be used in place of the bottom face film 10 and the resin layer 12. Note that the resin layer 12 may be made of, for example, a polyimide. Alternatively, the resin layer 12 may be replaced by two resin films (e.g., polyimide films) and an inorganic insulating film sandwiched by these two films.

The barrier layer 3 (undercoat layer) is an inorganic insulating layer that prevents penetration by, for example, water, oxygen, and other foreign objects. The barrier layer 3 can be made of, for example, silicon nitride or silicon oxide.

The TFT layer 4 is a layer containing TFTs (thin film transistors). The TFT layer 4 includes: semiconductor films 15, inorganic insulating films 16 (gate insulating films) overlying the semiconductor films 15; gate electrodes GE and gate lines GH overlying the inorganic insulating films 16; inorganic insulating films 18 overlying the gate electrodes GE and the gate lines GH; capacitor electrodes CE overlying the inorganic insulating films 18; inorganic insulating films 20 overlying the capacitor electrodes CE; wiring lines including source lines SH overlying the inorganic insulating films 20; and planarization films 21 (interlayer insulating films) overlying the source lines SH. The TFT layer 4 includes TFTs as drive elements in such a manner that the TFTs include the semiconductor films 15 and the gate electrodes GE.

The semiconductor film 15 is made of, for example, low-temperature polysilicon (LTPS) or oxide semiconductor. Note that the TFT including the semiconductor film 15 as a channel is shown to have a top-gate structure in FIG. 1. Alternatively, the TFT may have a bottom-gate structure.

The barrier layer 3 and the inorganic insulating films 16, 18, 20 may include, for example, a silicon oxide ($SiO_x$) film, a silicon nitride ($SiN_x$) film, or a stack of these films, prepared by CVD (chemical vapor deposition). The planarization film 21 may be made of, for example, an organic material, such as a polyimide or an acrylic resin, that can be formed by printing or coating technology.

The gate electrodes GE, the capacitor electrodes CE, the source lines SH, and other wiring lines include, for example, a monolayer film of at least one of metals of Al (aluminum), W (tungsten), Mo (molybdenum), Ta (tantalum), Cr (chromium), Ti (titanium), and Cu (copper) or a stack of any of these films.

The light-emitting element layer 5 includes a plurality of light-emitting elements ES. In the present embodiment, the light-emitting element layer 5 is a QLED layer, and there is provided a plurality of QLEDs as the light-emitting elements ES. Each light-emitting element ES is associated with one of the subpixels SP, so that each subpixel SP includes one of the light-emitting elements ES.

Figure 2:
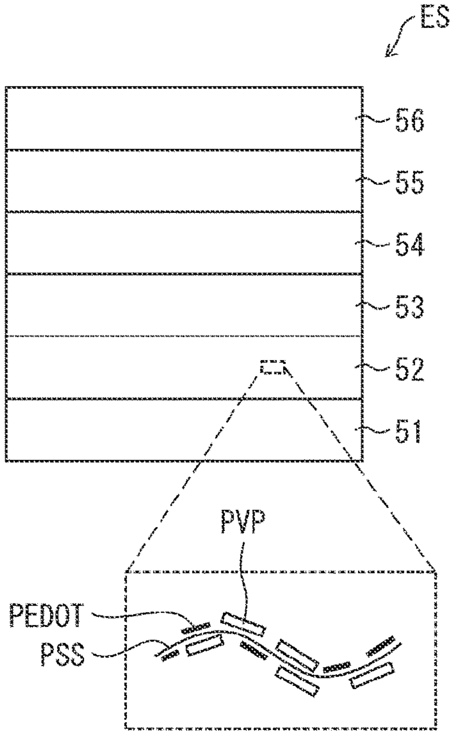
FIG. 2 is a schematic diagram of an exemplary layered structure of a light-emitting element in accordance with Embodiment 1.

FIG. 2 is a schematic diagram of an exemplary layered structure of the light-emitting element ES in accordance with the present embodiment.

Referring to FIG. 2, the light-emitting element ES includes an anode 51, a cathode 56, and a light-emitting layer (hereinafter, will be referred to as an "EML") 54 between the anode 51 and the cathode 56. Note that in the present embodiment, the layers between the anode 51 and the cathode 56 are collectively referred to as "functional layers."

A hole-transportable, first functional layer is provided in contact with the anode 51 between the anode 51 and the EML 54.

The following will describe an example of the light-emitting element ES in accordance with the present embodiment where the first functional layer is a hole injection layer (hereinafter, will be referred to as an "HIL") 52, and the light-emitting element ES further includes a hole transport layer (hereinafter, will be referred to as an "HTL") 53 between the HIL 52 and the EML 54. Note that there may be provided, for example, an electron transport layer (hereinafter, will be referred to as an "ETL") 55 between the EML 54 and the cathode 56 as shown in FIG. 2.

In the present embodiment, the direction from the array substrate 2 toward the cathode 56 is "upward," while its opposite direction is "downward." Additionally, in the present embodiment, expressions like "component A underlies/is below component B" indicate that component A is formed in an earlier process or step than component B, and expressions like "component A overlies/is on or above component B" indicate that component A is formed in a later process or step than component B.

As an example of the light-emitting element ES in accordance with the present embodiment, the light-emitting element ES shown in FIG. 2 includes the anode 51, the HIL 52, the HTL 53, the EML 54, the ETL 55, and the cathode 56, all of which are provided in this order when viewed from the array substrate 2 (i.e., when viewed from the underlying side).

Referring to FIG. 1, the display device 1 includes, as the subpixels SP, for example, red light-emitting subpixels RSP (red subpixels), green light-emitting subpixels GSP (green subpixels), and blue light-emitting subpixels BSP (blue subpixels).

Each subpixel RSP includes, as the light-emitting element ES, a red light-emitting element RES (red light-emitting element, red QLED). Each subpixel GSP includes, as the light-emitting element ES, a green light-emitting element GES (green light-emitting element, green QLED). Each subpixel BSP includes, as the light-emitting element ES, a blue light-emitting element BES (blue light-emitting element, blue QLED).

Here, red light refers to light that has a peak emission wavelength in the wavelength range of from 600 nm exclusive to 780 nm inclusive. Green light refers to light that has a peak emission wavelength in the wavelength range of from 500 nm exclusive to 600 nm inclusive. Blue light refers to light that has a peak emission wavelength in the wavelength range of from 400 nm to 500 nm, both inclusive.

Note that in the present embodiment, when it is not particularly necessary to distinguish between the light-emitting element RES, the light-emitting element GES, and the light-emitting element BES, these light-emitting elements RES, GES, and BES are collectively referred to as the "light-emitting elements ES." In addition, in the present embodiment, when it is not particularly necessary to distinguish between the subpixels RSP, the subpixels GSP, and the subpixels BSP, these subpixels RSP, GSP, and BSP are collectively referred to as the "subpixels SP." In addition, in relation to the layers in the light-emitting elements ES, when it is not particularly necessary to distinguish between the light-emitting element RES, the light-emitting element GES, and the light-emitting element BES, the layers are collectively referred to in a similar manner.

Referring to FIG. 1, the anode 51, the HIL 52, the HTL 53, the EML 54, and the ETL 55 in each subpixel SP are separated insularly from the other subpixels SP by a bank BK covering the edge of the anode 51. In contrast, the cathode 56 is not separated by the bank BK and provided as a common layer that is common to the subpixels SP. Therefore, in the present embodiment, the anode 51 is an insularly patterned anode (patterned anode). The anode 51 in the subpixel SP is electrically connected to the plurality of TFTs in the TFT layer 4 respectively. The cathode 56 is a cathode (common cathode) provided commonly to all the subpixels SP.

The light-emitting element RES shown in FIG. 1 includes an HIL 52R as the HIL 52, an HTL 53R as the HTL 53, an EML 54R as the EML 54, and an ETL 55R as the ETL 55. In addition, the light-emitting element GES shown in FIG. 1 includes an HIL 52G as the HIL 52, an HTL 53G as the HTL 53, an EML 54G as the EML 54, and an ETL 55G as the ETL 55. In addition, the light-emitting element BES shown in FIG. 1 includes an HIL 52B as the HIL 52, an HTL 53B as the HTL 53, an EML 54B as the EML 54, and an ETL 55B as the ETL 55.

Therefore, the light-emitting element RES shown in FIG. 1 has a structure in which the anode 51, the HIL 52R, the HTL 53R, the EML 54R, the ETL 55R, and the cathode 56 are provided in this order when viewed from the array substrate 2. In addition, the light-emitting element GES shown in FIG. 1 has a structure in which the anode 51, the HIL 52G, the HTL 53G, the EML 54G, the ETL 55G, and the cathode 56 are provided in this order when viewed from the array substrate 2. In addition, the light-emitting element BES shown in FIG. 1 has a structure in which the anode 51, the HIL 52B, the HTL 53, the EML 54, the ETL 55, and the cathode 56 are provided in this order when viewed from the array substrate 2.

As described above, the bank BK serves as an edge cover covering the edge of the anode 51 and serves also as a subpixel separation film (light-emitting element separation film).

The bank BK is formed by, for example, applying an organic material such as a polyimide or an acrylic resin and then patterning the applied material by photolithography.

The anode 51 and the cathode 56 are placed under a voltage when connected to a power supply (e.g., DC power supply) (not shown).

The anode 51 is an electrode that, when placed under a voltage, feeds holes to the EML 54. The anode 51 contains a conductive material and is electrically connected to the HIL 52.

The cathode 56 is an electrode that, when placed under a voltage, feeds electrons to the EML 54. The cathode 56 contains a conductive material and is electrically connected to the ETL 55.

One of the anode 51 and the cathode 56 through which light is taken out needs to be transparent. Each of the anode 51 and the cathode 56 may either be a monolayer or have a layered structure.

Therefore, when the display device 1 is of a bottom-emission type in which light is taken out through the anode 51 side, which is an underlying electrode side, the anode 51 is a translucent electrode that passes light. Then, the cathode 56, which is an overlying electrode, is, for example, a "reflective electrode" that reflects light. Note that the reflective electrode may be made of, for example, a light-reflecting material such as Ag, Al (aluminum), or another like metal or an alloy of these metals. As an alternative, the reflective electrode may be prepared by stacking a transparent material and a light-reflecting material.

In contrast, when the display device 1 is of a top-emission type in which light is taken out through the cathode 56 side, which is an overlying electrode side, the cathode 56 is a translucent electrode, and the anode 51 is a reflective electrode.

The anode 51 in accordance with the present embodiment contains a metal oxide. The anode 51 is preferably made of a material that that has a relatively large work function and exhibits excellent electric conductance in view of hole injection. Metal oxides have a large work function and exhibits excellent electric conductance and can be suitably used as a material for the anode 51.

The metal oxide is not limited in any particular manner and may be, for example, tin-doped indium oxide (ITO), zinc-doped indium oxide (IZO), aluminum-doped zinc oxide (AZO), gallium-doped zinc oxide (GZO), or antimony-doped tin oxide (ATO). Any one of these materials may be used alone; alternatively, two or more of the materials may be used in the form of mixture where appropriate. Among these metal oxides, ITO and IZO have a large work function and exhibit excellent electric conductance and particularly high transparence. ITO and IZO can be therefore suitably used as a material for the anode 51.

In contrast, when the display device 1 is of a top-emission type, the anode 51 is a reflective electrode that is a stack of a metal-oxide-containing transparent material and a light-reflecting material. In such cases, the anode 51 is, as an example, a reflective electrode in which ITO/Ag alloy/ITO, ITO/Ag/ITO, or Al/IZO are stacked in this order from the underlying side.

The cathode 56 is preferably made of, for example, a material that has a relatively small work function. The cathode 56 may be made of, for example, aluminum (Al), silver (Ag), barium (Ba), ytterbium (Yb), calcium (Ca), a lithium (Li)—Al alloy, a magnesium (Mg)—Al alloy, a Mg—Ag alloy, a Mg-indium (In) alloy, or an Al-aluminum oxide ($Al_2O_3$) alloy.

Therefore, when the display device 1 is of a bottom-emission type, the cathode 56 is, for example, a reflective electrode containing a light-reflecting material such as an Al electrode.

Meanwhile, when the display device 1 is of a top-emission type, the cathode 56 may be, for example, a translucent electrode (transparent electrode) that passes light such as ITO or IZO and may alternatively be a translucent electrode that is semi-transparent such as a thin film of a Mg—Ag alloy or a thin film of Ag. In addition, when the display device 1 is of a top-emission type, the cathode 56 may be, for example, an NW (nanowire) such as AgNW (silver nanowire).

The EML 54 is a layer that emits light from recombination of the holes transported from the anode 51 and the electrons transported from the cathode 56. As described above, when the light-emitting element ES is a QLED element, holes and electrons recombine in the EML 54 under the drive current flowing between the anode 51 and the cathode 56, which generates excitons that emit light when transitioning from the conduction band energy level to the valence band energy level of the quantum dots.

Quantum dots are inorganic nanoparticles composed of approximately from a few thousands of atoms to a few tens of thousands of atoms and having particle diameters of approximately from a few nanometers to a few tens of nanometers. Quantum dots are alternatively called fluorescent nanoparticles or QD fluorescent material particles because they fluorescence and have nanometer dimensions. Additionally, quantum dots are alternatively called semiconductor nanoparticles because they are made of a semiconductor material. Throughout the following description, quantum dots will be abbreviated as QDs.

The display device 1 includes QDs of each color as a light-emitting material in the subpixels SP. Specifically, the EML 54R in the subpixel RSP contains red QDs, the EML 54G in the subpixel GSP contains green QDs, and the EML 54B in the subpixel BSP contains blue QDs. In this manner, the EML 54 contains a plurality of kinds of QDs and contains the same kind of QDs in the same subpixels SP.

The red QDs, the green QDs, and the blue QDs may contain, for example, a semiconductor material containing at least one element selected from the group consisting of Cd (cadmium), S (sulfur), Te (tellurium), Se (selenium), Zn (zinc), In (indium), N (nitrogen), P (phosphorus), As (arsenic), Sb (antimony), Al (aluminum), Ga (gallium), Pb (lead), Si (silicon), Ge (germanium), and Mg (magnesium).

In addition, the red QDs, the green QDs, and the blue QDs may have a two-component core structure, a three-component core structure, a four-component core structure, a core-shell structure, or a core-multishell structure respectively. In addition, these QDs may contain doped nanoparticles or may have a composition gradient structure.

These QDs are able to have various emission wavelengths, depending on the particle diameters and composition. In other words, the above-described red, green, and blue light can be realized by adjusting the particle diameters and composition of the QDs in a suitable manner. Examples of such QDs include CdSe (cadmium selenide), InP (indium phosphide), and ZnSe (zinc selenide).

The ETL 55 is, as described above, disposed between the cathode 56 and the EML 54. The ETL 55 is electron-transportable and transports electrons from the cathode 56 to the EML 54. Note that the ETL 55 may have a function of disrupting the transport of holes.

The ETL 55 contains an electron transport material. This electron transport material is not limited in any particular manner and may be any one of various publicly known electron transport materials. Therefore, the electron transport material may be either an inorganic material or an organic material. As an example, the electron transport material may be, for example, ZnO (zinc oxide) or MgZnO (magnesium zinc oxide). Any one of these electron transport materials may be used alone; alternatively, two or more of the electron transport materials may be used in the form of mixture where appropriate. Note that the ETL 55R, the ETL 55G, and the ETL 55B may be made of either the same material or materials with different electron mobilities.

The HIL 52 is, as described above, disposed adjacent to the anode 51 (in other words, in direct contact with the anode 51) between the anode 51 and the EML 54. In addition, the HTL 53 is, as described above, disposed between the HIL 52 and the EML 54.

The HIL 52 has hole transportability and facilitates hole injection from the anode 51 to the EML 54. The HTL 53 has hole transportability and transports the holes injected from the HIL 52 to the EML 54. The HIL 52 and the HTL 53 each contain a hole transport material.

When the HIL 52 is disposed between the anode 51 and the HTL 53 as in the present embodiment, the hole transport material used in the HTL 53 is not limited in any particular manner and may be any one of various publicly known hole transport materials. Therefore, in this case, the hole transport material used in the HTL 53 may be either an organic material or an inorganic material. As an example, the hole transport material used in the HTL 53 in this case may be, for example, TFB (poly[(9,9-dioctylfluorenyl-2,7-diyl)-co-(4,4'-(N-4-sec-butylphenyl))diphenylamine)), p-TPD (poly [N,N'-bis(4-butylphenyl)-N,N'-bis(phenyl)-benzidine]), or PVK (polyvinyl carbazole). Any one of these hole transport materials may be used alone; alternatively, two or more of the materials may be used in the form of mixture where appropriate. Note that the HTL 53R, the HTL 53G, and the HTL 53B may be made of either the same material or materials with different hole mobilities.

In contrast, the HIL 52 in accordance with the present embodiment contains PEDOT:PSS (poly(3,4-ethylenedioxythiophene):poly(4-styrene sulfonate)) and PVP (polyvinylpyrrolidone). Of these materials, PEDOT:PSS is a hole transport material. PVP serves as a binder resin.

PEDOT:PSS is a composite of PEDOT (poly(3,4-ethylenedioxythiophene)) and PSS (poly(4-styrene sulfonate)). PEDOT:PSS has, for example, a structure of structural formula shown in Chem. 1 below.

[Chem. 1]

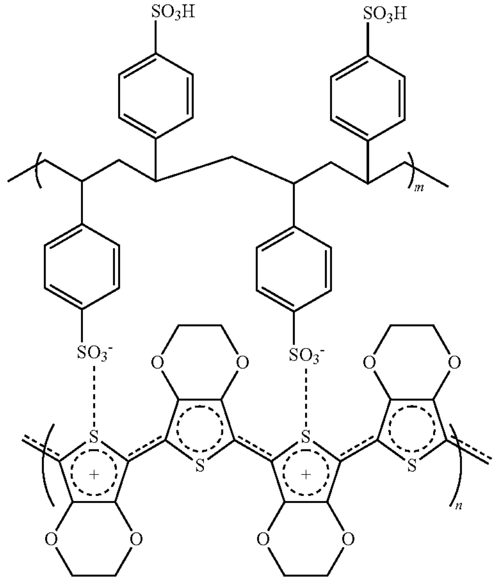

Figure 3:
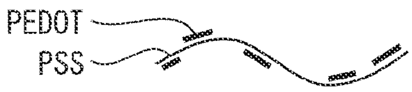
FIG. 3 is a schematic diagram of PEDOT:PSS.

FIG. 3 is a schematic diagram of PEDOT:PSS.

PEDOT:PSS is a hole transport material that exhibits excellent hole transportability. In addition, PEDOT:PSS has a high solubility (dispersibility) in aqueous mediums because the PSS coexisting as a dopant contains sulfonic acid groups as shown in structural formula (1) shown in Chem. 1.

However, as described above, hydrophobic PEDOT is easily crystallized. Therefore, if PEDOT:PSS is simply dissolved (dispersed) in an aqueous medium and applied to the surface of the anode 51 as in related art, the binding to the anode 51 is so unstable that the resultant layer becomes non-uniform.

In addition, in some parts of PEDOT:PSS, PEDOT is not coordinated to PSS, exposing PSS, as shown in structural formula shown in Chem. 1 and FIG. 3. More specifically, in some parts of PEDOT:PSS, the sulfonic acid groups remain unreacted and are not capped by PEDOT.

Therefore, if these unreacted sulfonic acid groups react with a metal oxide contained in the anode 51, the metal contained in the metal oxide is desorbed from the anode 51 and diffused into the surroundings.

Accordingly, in the present embodiment, an aqueous PEDOT:PSS-PVP solution prepared by dissolving (dispersing) PEDOT:PSS and PVP in an aqueous medium is used in forming the HIL 52. Note that in the present disclosure, PEDOT:PSS and PVP are described as being "dissolved" not only when PEDOT:PSS and PVP are dissolved in the form of ions in an aqueous medium, but also when PEDOT:PSS and PVP are dispersed in the form of colloid. Therefore, the "aqueous PEDOT:PSS-PVP solution" may be a dispersion solution in which PEDOT:PSS and PVP are dispersed in an aqueous medium.

PVP provides excellent film-formability and adhesibility and does not have adverse electrical effects. In addition, PVP has good compatibility with PEDOT:PSS and besides contributes to restraining crystallization of hydrophobic PEDOT. Therefore, the present embodiment enables forming the HIL 52 with a uniform thickness and enables efficiently injecting holes from the anode 51 to the EML 54 via the HTL 53. Therefore, the light-emitting element ES can emit uniform light.

Adding PVP to PEDOT:PSS causes unreacted sulfonic acid groups to react with the PVP, so that the sulfonic acid groups not capped by PEDOT are capped by PVP.

Hence, as shown in FIG. 1 with the HIL 52 being partially scaled up, the PVP is coordinated to a portion where no PEDOT is coordinated and PSS is exposed. Hence, the portion where PSS is exposed is covered by the PVP.

Therefore, the present embodiment enables preventing the sulfonic acid groups in PSS from reacting with the metal oxide contained in the anode 51, hence enabling preventing the metal contained in the metal oxide from being desorbed from the anode 51. Therefore, the temporal decay of the anode 51 is restrained, and the resultant light-emitting element ES has improved reliability.

Therefore, even when the anode 51 is made of an In (indium)-containing metal oxide such as ITO or IZO, the present embodiment enables preventing the metal oxide from reacting with the sulfonic acid groups in the PSS, hence enabling preventing In from being desorbed. Therefore, the present embodiment enables suitably using an In-containing metal oxide such as ITO or IZO in the anode 51 as described above.

In the present embodiment, PEDOT:PSS and PVP are preferably mixed so that the PVP content per unit part by weight of PSS is from 0.16 parts by weight inclusive to 1.5 parts by weight exclusive. Therefore, the composition ratio of PEDOT:PSS and PVP in the HIL 52 is preferably such that the PVP content per unit part by weight of PSS in PEDOT:PSS is from 0.16 parts by weight inclusive to 1.5 parts by weight exclusive.

Specifying the PVP content per unit part by weight of PSS in the HIL 52 to be from 0.16 parts by weight inclusive to 1.5 parts by weight exclusive as described here enables obtaining a light-emitting element ES that restrains crystallization of PEDOT, that includes a HIL 52 with a uniform thickness, and that emits uniform light as described above. Besides, as described above, PVP has high film-formability and excellent adhesibility and has no adverse electrical effects. Therefore, the HIL 52 containing PEDOT:PSS and PVP in the above-described proportion enables obtaining a light-emitting element ES that exhibits a high external quantum efficiency and high reliability.

However, if the PVP content per unit part by weight of PSS in the HIL 52 is less than 0.16 parts by weight, the effects of adding PVP may not be sufficiently achieved. As described above, in the present embodiment, the addition of PVP to PEDOT:PSS enables the sulfonic acid groups not capped by PEDOT in PSS to be capped by PVP. Therefore, the reaction of the sulfonic acid groups in PSS and the metal oxide is restrained, and the resultant light-emitting element ES has improved reliability. In addition, the crystallization of PEDOT is restrained, the thickness of the HIL 52 becomes uniform, and the light-emitting element ES emits uniform light.

On the other hand, if the PVP content per unit part by weight of PSS in the HIL 52 exceeds 1.5 parts by weight, the capping of the sulfonic acid groups in PSS with PVP can similarly deliver the effect of restraining the reaction of the sulfonic acid groups in PSS and the metal oxide. In addition, the crystallization of PEDOT can also be restrained. However, since the composition ratio of PVP to PEDOT:PSS is too large, the hole transportability falls, leading to a decrease in the external quantum efficiency. Therefore, the composition ratio of PEDOT:PSS and PVP in the HIL 52 is preferably specified such that the PVP content per unit part by weight of PSS in the HIL 52 is equal to the above-described value.

In addition, in the present embodiment, PEDOT:PSS and PVP are preferably mixed such that the PVP amount per unit part by weight of PSS is from 0.3 parts by weight to 0.7 parts by weight, both inclusive. Therefore, the PVP content per unit part by weight of PSS in the HIL 52 is more preferably from 0.3 parts by weight to 0.7 parts by weight, both inclusive. Hence, for example, an external quantum efficiency of greater than or equal to 11% can be achieved as demonstrated in an example of the disclosure detailed later.

Note that the PEDOT:PSS is, for example, a commercially available PEDOT:PSS, and the blending amount (doping amount) of the PSS relative to PEDOT in the PEDOT:PSS is not limited in any particular manner. However, the PEDOT:PSS as a hole transport material contains a large PSS blending amount relative to PEDOT to increase specific resistance and reduce leak current. Therefore, typically, 4 parts by weight to 8 parts by weight of PSS is blended with 1 part by weight of PEDOT.

The sealing layer 6 prevents permeation of water, oxygen, and other foreign objects into the light-emitting element layer 5. Referring to FIG. 1, the sealing layer 6 includes, for example: an inorganic sealing film 61 covering the cathode 56; an organic buffer film 62 overlying the inorganic sealing film 61; and an inorganic sealing film 63 overlying the organic buffer film 62.

Both the inorganic sealing film 61 and the inorganic sealing film 63 are transparent inorganic insulating films and may include, for example, a silicon oxide ($SiO_x$) film, a silicon nitride ($SiN_x$) film, a silicon oxynitride film (SiNO), or a stack of these films, prepared by CVD (chemical vapor deposition).

The organic buffer film 62 is a transparent organic film that has a planarization effect and may be made of an organic material, such as an acrylic resin, that can be provided by printing or coating technology. The organic buffer film 62 may be formed by, for example, inkjet printing, and there may be provided a bank (not shown) for stopping liquid drops in the frame area.

Note that the thickness of each layer in the light-emitting element ES is not limited in any particular manner and may be specified similarly to related art. The layers in the light-emitting element RES, the light-emitting element GES, and the light-emitting element BES may have the same thickness or different thicknesses. The HIL 52 preferably has a thickness within the range of, for example, from 30 to 50 nm. This specification, for example, prevents pinholes and changes in the chromaticity (hue) of the color of emitted light, thereby enabling a higher external quantum efficiency.

In addition, there may be provided a functional film selected suitably according to an application on the sealing layer 6. The functional film may be, for example, a functional film that has at least one of an optical compensation function, a touch sensor function, and a protection function. Note that when the display device 1 is a solid display device (i.e., non-flexible display device), for example, a glass substrate such as a touch panel, a polarizer, or a glass cover may be provided in place of the functional film.

Method of Manufacturing Display Device 1

A description is given next of a method of manufacturing the display device 1.

Figure 4:
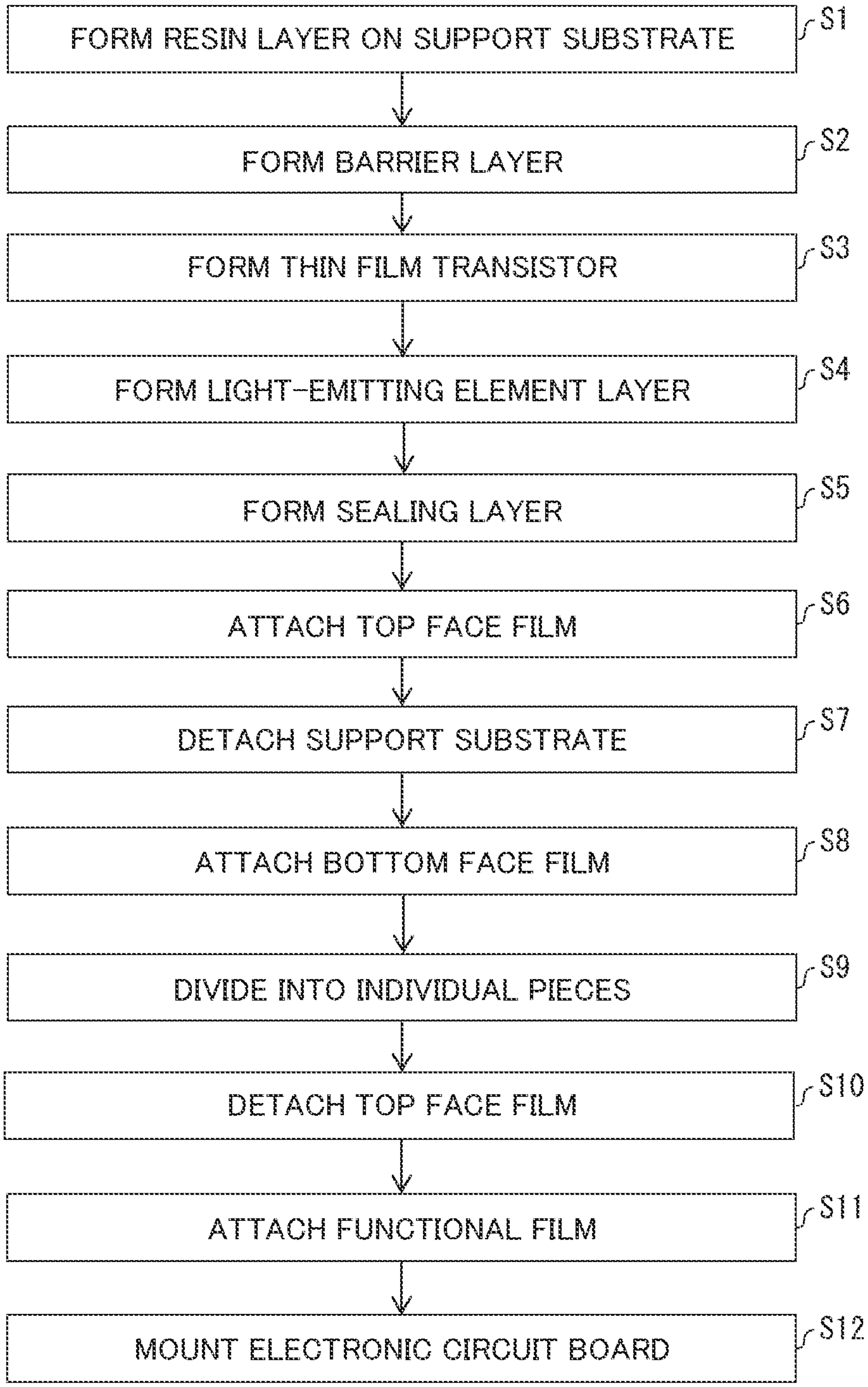
FIG. 4 is a flow chart representing exemplary steps of manufacturing the display device in accordance with Embodiment 1.

FIG. 4 is a flow chart representing exemplary steps of manufacturing the display device 1 in accordance with the present embodiment.

The following will describe an example where a flexible display device is manufactured as the display device 1.

To manufacture a flexible display device as the display device 1, as shown in FIG. 4, first, the resin layer 12 is formed on a transparent support substrate (e.g., mother glass; not shown) (step S1). Next, the barrier layer 3 is formed (step S2). Next, the TFT layer 4 is formed (step S3). Next, the light-emitting element layer 5 is formed (step S4). Next, the sealing layer 6 is formed (step S5). Next, a protective top face film (not shown) is temporarily attached onto the sealing layer 6 (step S6). Next, the support substrate is detached from the resin layer 12 by, for example, laser irradiation (step S7). Next, the bottom face film 10 is attached to the bottom face of the resin layer 12 (step S8). Next, the stack of the bottom face film 10, the resin layer 12, the barrier layer 3, the TFT layer 4, the light-emitting element layer 5, the sealing layer 6, and the top face film is divided to obtain a plurality of individual pieces (step S9). Next, after the top face film is detached from the obtained individual pieces (step S10), a functional film is attached (step S11). Next, an electronic circuit board (e.g., IC chip or FPC; not shown) is mounted on a part (terminal portion) that is outside (frame area) of the display area where the plurality of subpixels SP are provided (step S12).

Note that steps S1 to S12 are performed by display device manufacturing equipment (including a film-forming machine that performs steps S1 to S5).

In addition, the top face film is, as described above, attached onto the sealing layer 6 and serves as a support member after the support substrate is detached. The top face film may be, for example, a PET (polyethylene terephthalate) film.

Note that the preceding description has discussed a method of manufacturing a flexible display device 1. However, when a non-flexible display device 1 is manufactured, it is generally unnecessary to, for example, form the resin layer 12 and exchange the base members. Therefore, to manufacture a non-flexible display device 1, for example, the stacking steps of S2 to S5 are performed on a glass substrate, and thereafter the process proceeds to step S9.

Figure 5:
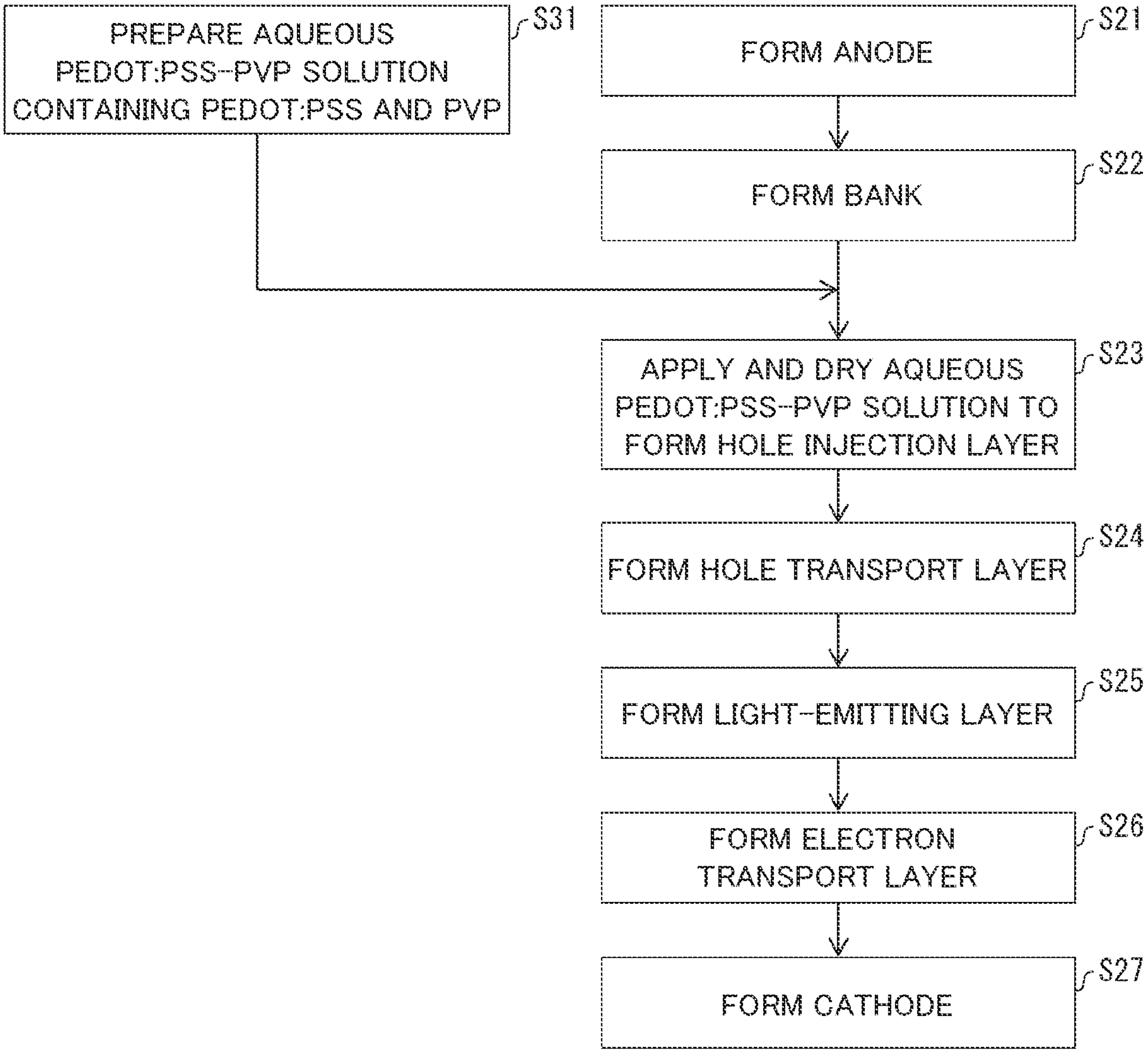
FIG. 5 is a flow chart representing exemplary steps of forming a light-emitting element layer shown in FIG. 4.

FIG. 5 is a flow chart representing exemplary steps of forming the light-emitting element layer 5 indicated as step S4 in FIG. 4.

In the step of forming the light-emitting element layer 5, as shown in FIG. 5, first, the anode 51 is formed on the TFT layer 4 (i.e., on the array substrate 2) (step S21). Next, the bank BK is formed (step S22). In addition, an aqueous PEDOT:PSS-PVP solution is separately prepared (solution is prepared) as a material solution (HIL solution) for use in forming the HIL 52 (hole injection layer) (step S31). Then, after step S22 and step S31, the HIL 52 (hole injection layer) is formed by liquid-phase film formation (step S23). Specifically, the anode 51 is coated with the aqueous PEDOT:PSS-PVP solution containing PEDOT:PSS and PVP and thereafter dried to form the HIL 52. Next, the HTL 53 (hole transport layer) is formed (step S24). Next, the EML 54 (light-emitting layer) is formed (step S25). Next, the ETL 55 (electron transport layer) is formed (step S26). Next, the cathode 56 is formed (step S27).

As described above, the aqueous PEDOT:PSS-PVP solution used in step S23 is prepared (solution is prepared) in advance before step S23 is performed. Therefore, the method of manufacturing the light-emitting element ES separately further involves, as shown in FIG. 5, an aqueous PEDOT:PSS-PVP solution preparation step (step S31) of preparing the aqueous PEDOT:PSS-PVP solution before step S23.

In step S21 and step S27, the anode 51 and the cathode 56 can be formed by, for example, physical vapor deposition (PVD) such as sputtering or vacuum vapor deposition, spin-coating, or inkjet printing.

In step S22, the bank BK can be formed in a desirable shape by, for example, patterning, by photolithography, a layer of an insulating material deposited by, for example, PVD such as sputtering or vacuum vapor deposition, spin-coating, or inkjet printing.

In addition, in step S24 and step S26, the HTL 53 and the ETL 55 are formed by, for example, PVD such as sputtering or vacuum vapor deposition, spin-coating, or inkjet printing.

In step S25, when the light-emitting element ES is, as described above, a QLED, and the EML 54 is a QD light-emitting layer containing QDs, the EML 54 can be formed by applying a QD-dispersed solution containing QDs and thereafter drying this QD-dispersed solution. The QD-dispersed solution is applied by, for example, spin-coating or inkjet printing. Note that the QD-dispersed solution is dried by, for example, removing by vaporization of the medium by baking. The drying temperature (baking temperature) is not limited in any particular manner, but is preferably specified approximately to a temperature at which the medium can be removed, to prevent thermal damage.

More specifically, when the EML 54 is a QD light-emitting layer as described above, for example, first, a lift-off-use template is formed in an area other than an EML-formed area on the HTL 53 which is an underlying layer (area where EML to be formed is not formed). Next, a QD-dispersed solution containing QDs and a medium is applied onto the underlying layer, and the template is detached. Hence, a desirable EML can be formed in a pattern in the EML-formed area.

Note that the template can be formed by, for example, applying and thereafter calcinating a resist for the template, exposing the resist to UV light (ultraviolet light) using a mask, and thereafter developing the resist.

As described above, when the display device 1 includes, as the subpixels SP, for example, the subpixels RSP, the subpixels GSP, and the subpixels BSP, the step of forming the template through the step of detaching the template are repeated 3 times to form EMLs of 3 colors.

In addition, in step S31, in preparing the aqueous PEDOT:PSS-PVP solution, PEDOT:PSS and PVP are mixed so that the PVP amount per unit part by weight of PSS is, as described above, for example, from 0.16 parts by weight inclusive to 1.5 parts by weight exclusive.

Note that as described above, in aforementioned step S31, PEDOT:PSS and PVP are more preferably mixed so that the PVP amount per unit part by weight of PSS is from 0.3 parts by weight to 0.7 parts by weight, both inclusive.

The aqueous medium used in the aqueous PEDOT:PSS-PVP solution is not limited in any particular manner so long as the medium is a water-containing aqueous medium that is capable of dissolving (dispersing) PEDOT:PSS and PVP. The aqueous medium may be, for example, either water alone or a medium mixture of water and another medium (e.g., an alcohol-based polar solvent). However, since sulfonic acid groups have high polarity and high solubility in water, the aqueous medium is preferably water.

Note that the concentration of the aqueous PEDOT:PSS-PVP solution is not limited in any particular manner so long as the aqueous PEDOT:PSS-PVP solution has such a concentration or viscosity that the aqueous PEDOT:PSS-PVP solution can be provided by printing or coating technology and may be specified in a suitable manner in accordance with the printing or coating method. It should be understood however that the thickness of the resultant film (layer thickness) can vary depending on the concentration. Therefore, for example, the concentration of the aqueous PEDOT:PSS-PVP solution is preferably specified such that the total amount of PEDOT:PSS and PVP relative to the aqueous medium is from 1.2 to 2.5 wt %, to obtain the aforementioned practical layer thickness as the layer thickness of the HIL 52.

As described above, PEDOT:PSS has high solubility (dispersibility) in an aqueous medium because PSS contains sulfonic acid groups. In addition, PVP has high solubility in various mediums. Therefore, the aqueous PEDOT:PSS-PVP solution can be readily obtained by, for example, adding and mixing PVP with an aqueous PEDOT:PSS solution prepared by dissolving (dispersing) PEDOT:PSS in a water medium.

Note that although in the present embodiment, as an example, PVP is added to an aqueous PEDOT:PSS solution, the present embodiment is not limited to this example. The order of blending (order of mixing) a water medium, PEDOT:PSS, and PVP is not limited in any particular manner. In addition, a water medium, PEDOT:PSS, and PVP may be mixed by any method.

In addition, in step S23, the HIL 52 can be formed, as described above, by applying an aqueous PEDOT:PSS-PVP solution containing PEDOT:PSS and PVP onto the anode 51 and thereafter drying the aqueous PEDOT:PSS-PVP solution.

Note that the aqueous PEDOT:PSS-PVP solution may be applied by, for example, spin-coating or inkjet printing. In addition, the aqueous PEDOT:PSS-PVP solution is dried by, for example, removing by vaporization of the medium by baking. The drying temperature (baking temperature) is not limited in any particular manner, but is preferably specified approximately to a temperature at which the medium can be removed, to prevent thermal damage.

Note that PVP, including PEDOT:PSS, has high compatibility with various resins. Therefore, the aqueous PEDOT:PSS-PVP solution may contain additives other than a water medium, PEDOT:PSS, and PVP, provided that the additives do not adversely affect the aforementioned effects of the light-emitting element ES in accordance with the present embodiment such as reliability and external quantum efficiency. Note that these additives are not limited in any particular manner so long as the additives do not adversely affect the aforementioned effects and are also dissolved (dispersed) in a water medium, and the aqueous PEDOT:PSS-PVP solution may contain a resin other than PVP and PEDOT:PSS. Therefore, the HIL 52 may contain a resin other than PVP and PEDOT:PSS.

The light-emitting element ES and the display device 1 in accordance with the present embodiment can be manufactured by these steps.

EXAMPLES OF DISCLOSURE

A description is given next of the effects of the light-emitting element ES in accordance with the present embodiment by way of examples and comparative examples. Note that the light-emitting element ES in accordance with the present embodiment is not limited only to the examples below.

Note that various physical properties were measured and/or evaluated by the following methods in the examples and comparative examples below.

Reliability Test

In a cell fabricated as a light-emitting element for the purpose of evaluation, letting the luminance achieved when an electric current having a current density of 5 mA/$cm^2$ was passed in the initial state (initial luminance) be equal to 100%, an electric current having a current density of 5 mA/$cm^2$ was continuously passed in the cell, and the time it took for the luminance to decrease to 50% of the initial luminance (H) was measured. Note that luminance was measured using a luminance measuring instrument (model number: EAS-10R) manufactured by "Sisutemu Giken Co., Ltd."

External Quantum Efficiency

The external quantum efficiency (Notexe)) was evaluated by means of the number of photons (Np) extracted from a unit area of a cell fabricated as a light-emitting element for the purpose of evaluation with respect to the number of carriers (Ne) injected to the cell as represented by the following expressions.

$$Np=\lambda/hc\times P\times 1/S(1/m^2)$$

$$Ne=I/e\times 1/S(1/m^2)$$

$$N_{o(exe)}=Np/Ne\times 100=(P\times\lambda\times e)/(hc\times I)\times 100(\%)$$

where I is an electric current (A), P is light intensity (light amount measurement (W)), S is the area of the cell (element area ($m^2$)), λ is a peak emission wavelength (m), e is the elementary charge (A·s), h is Planck's constant (J·s), and c is the speed of light ($m\cdot s^{-1}$).

Electric current (I) was measured using a 2400 Source Meter manufactured by Keithley Instrument Inc. Light intensity (P) was measured using a light intensity meter (model number: BM-5A) manufactured by Topcon House Corp. The area of the cell was set to $4\times10^{-6}$ ($m^2$). The peak emission wavelength (λ) was set to 536 (nm). Planck's constant was set to $6.626\times10^{-34}$ J·s. The elementary charge (e) was set to $1.602\times10^{-19}$ A·s. The speed of light (c) was set to $2.998\times10^{8}$ ($m\cdot s^{-1}$).

Example 1

First, an ITO substrate that carried ITO thereon as an anode was prepared and rinsed. Meanwhile, an aqueous PEDOT:PSS solution was prepared by dissolving (dispersing), in water, PEDOT:PSS prepared by doping PEDOT with PSS such that the PVP doping amount per unit part by weight of PEDOT was equal to 6 parts by weight. Then, PVP was added to, and mixed with, this aqueous PEDOT:PSS solution such that the PVP blending amount per 6 parts by weight of PSS was 1 part by weight. An aqueous PEDOT:PSS-PVP solution as an HIL solution was thus prepared eventually containing 1.5 wt % PEDOT:PSS and PVP (total amount) relative to water.

Examples 2 to 8 and Comparative Examples 1 to 2

An aqueous PEDOT:PSS-PVP solution was prepared eventually containing 1.5 wt % PEDOT:PSS and PVP (total amount) relative to water, by changing the PVP blending amount relative to PSS as shown in Table 1 given below. Cells were fabricated as light-emitting elements for the purpose of evaluation, by performing the same process as Example 1 except for these points. Thereafter, the reliability test and external quantum efficiency measurement were performed on the cells.

Next, after the aqueous PEDOT:PSS-PVP solution was applied onto the ITO substrate by spin-coating, the ITO substrate was baked at 150° C. for 30 minutes to evaporate the medium. An HIL was hence formed with a layer thickness (design value, in other words, rough thickness) of 30 nm.

Next, after a solution prepared by dissolving (dispersing) TFB in chlorobenzene to 8 mg/mL was applied onto the HIL by spin-coating, the ITO substrate was baked at 110° C. for 30 minutes to evaporate the medium. An HTL was hence formed with a layer thickness (design value) of 30 nm.

Next, after a QD solution (colloid-dispersed solution) prepared by dissolving (dispersing) QDs in octane to 20 mg/mL was applied onto the HTL by spin-coating, the ITO substrate was baked at 110° C. for 10 minutes to evaporate the medium. The QDs had a core/shell structure of Cd/Se. An EML was hence formed with a layer thickness (design value) of 20 nm.

Next, after a solution (colloid-dispersed solution) prepared by dissolving (dispersing) ZnO in ethanol to 2.5 wt % was applied onto the EML by spin-coating, the ITO substrate was baked at 110° C. for 30 minutes to evaporate the medium. An ETL was hence formed with a layer thickness (design value) of 50 nm.

Next, Al was vapor-deposited onto the ETL to form a cathode with a layer thickness (design value) of 100 nm.

Thereafter, a stack body including all the layers from the HIL through the cathode formed on the ITO substrate was sealed with a glass cover. A cell was hence fabricated as a light-emitting element for the purpose of evaluation.

Next, the above-described reliability test and external quantum efficiency measurement were performed on the fabricated cell.

Examples 2 to 8 and Comparative Examples 1 to 2

An aqueous PEDOT:PSS-PVP solution was prepared eventually containing 1.5 wt % PEDOT:PS and PVP (total amount) relative to water, by changing the PVP blending amount relative to PSS as shown in Table 1 given below. Cells were fabricated as light-emitting elements for the purpose of evaluation, by performing the same process as Example 1 except for these points. Thereafter, the reliability test and external quantum efficiency measurement were performed on the cells.

Table 1 collectively shows the mix ratio (blending ratio) of PEDOT, PSS, and PVP and the mix ratio (blending ratio) of PVP relative to PSS, and the external quantum efficiencies of the fabricated cells, as well as results of the reliability test, for the HIL solutions used in Examples 1 to 8 and Comparative Examples 1 to 2.

TABLE 1

| | HIL Solution | | | | | |
|---|---|---|---|---|---|---|
| | PEDOT (parts by weight) | PSS (parts by weight) | PVP (parts by weight) | PVP Blending Proportion (parts by weight) Relative to PSS | External Quantum Efficiency (%) | Reliability Test (Time Taken by Luminance to Decrease to 50% of Initial Luminance) (H) |
| Example 1 | 1 | 6 | 1 | 0.167 | 10.7 | 202 |
| Example 2 | 1 | 6 | 2 | 0.333 | 11.0 | 210 |
| Example 3 | 1 | 6 | 3 | 0.5 | 11.5 | 228 |

TABLE 1-continued

| | HIL Solution | | | | | |
|---|---|---|---|---|---|---|
| | PEDOT (parts by weight) | PSS (parts by weight) | PVP (parts by weight) | PVP Blending Proportion (parts by weight) Relative to PSS | External Quantum Efficiency (%) | Reliability Test (Time Taken by Luminance to Decrease to 50% of Initial Luminance) (H) |
| Example 4 | 1 | 6 | 4 | 0.667 | 11.2 | 255 |
| Example 5 | 1 | 6 | 5 | 0.833 | 10.5 | 321 |
| Example 6 | 1 | 6 | 6 | 1.0 | 10.3 | 374 |
| Example 7 | 1 | 6 | 7 | 1.167 | 10.1 | 301 |
| Example 8 | 1 | 6 | 8 | 1.333 | 10.0 | 273 |
| Comparative Example 1 | 1 | 6 | — | — | 10.9 | 177 |
| Comparative Example 2 | 1 | 6 | 9 | 1.5 | 9.5 | 244 |

It is understood from the results shown in Table 1 that those cells fabricated by using an aqueous PEDOT:PSS-PVP solution containing both PEDOT:PSS and PVP as an HIL solution are evaluated as being more reliable than those cells fabricated by using an HIL solution containing no PVP.

It is also understood from the results shown in Table 1 that addition of too much PVP reduces the external quantum efficiency. It is additionally understood that the PVP blending amount per unit part by weight of PSS is preferably from 0.16 parts by weight inclusive to 1.5 parts by weight exclusive. It is also understood that a higher external quantum efficiency, for example, greater than or equal to 11% can be achieved when the PVP content per unit part by weight of PSS is from 0.3 parts by weight to 0.7 parts by weight, both inclusive.

These results show that in the present embodiment, it is preferred that the anode contains a metal oxide, the HIL contains both PEDOT:PSS and PVP, and the PVP content per unit part by weight of PSS in the HIL is from 0.16 parts by weight inclusive to 1.5 parts by weight exclusive.

With the HIL containing PEDOT:PSS and PVP in the above-described proportions, the resultant light-emitting element has a high external quantum efficiency and exhibits high reliability, and it becomes possible to provide a display device or like light-emitting device that includes such a light-emitting element, as described above.

Embodiment 2

The following will describe another embodiment of the present disclosure. The following will focus on differences from Embodiment 1. Note that for convenience of description, members of the present embodiment that have the same function as members of the preceding embodiment are indicated by the same reference numerals, and description thereof is not repeated.

Embodiment 1 discussed an example where the hole-transportable, first functional layer is an HIL 52. However, the first functional layer is not necessarily limited to the HIL 52 and needs only to have hole transportability and be disposed in contact with the anode 51 between the anode 51 and the EML 54. Therefore, the first functional layer may be an HTL.

Figure 6:
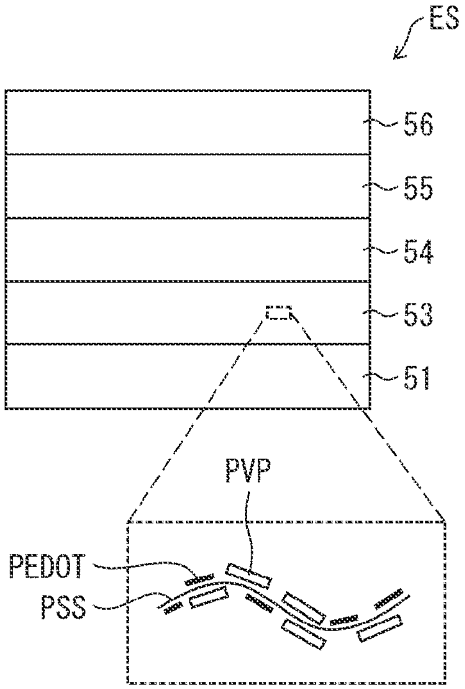
FIG. 6 is a schematic diagram of an exemplary layered structure of a light-emitting element in accordance with Embodiment 2.

FIG. 6 is a schematic diagram of an exemplary layered structure of the light-emitting element ES in accordance with the present embodiment.

The light-emitting element ES in accordance with the present embodiment, as shown in FIG. 6, includes an anode 51, an HTL 53, an EML 54, an ETL 55, and a cathode 56, all of which are provided in this order when viewed from the array substrate 2, and the HTL 53 is disposed in contact with the anode 51 between the anode 51 and the EML 54.

Therefore, the HTL 53 in accordance with the present embodiment contains both PEDOT:PSS and PVP as shown in FIG. 6. Note that the blending proportion of PEDOT, PSS, and PVP in the HTL 53 is the same as in the HIL 52 in accordance with Embodiment 1. In the present embodiment, an aqueous PEDOT:PSS-PVP solution is used as a material solution (HTL solution) for use in forming the HTL 53. In the present embodiment, the HTL 53 can be formed by applying an aqueous PEDOT:PSS-PVP solution containing PEDOT:PSS and PVP onto the anode 51 and then drying the aqueous PEDOT:PSS-PVP solution. The description of the HIL 52 in accordance with Embodiment 1 may be read as the description of the HTL 53 in accordance with the present embodiment, by reading "HIL" as "HTL."

Note that in the present embodiment, the thickness of each layer in the light-emitting element ES is not limited in any particular manner and may be specified similarly to related art. The layers in the light-emitting element RES, the light-emitting element GES, and the light-emitting element BES may have the same thickness or different thicknesses. The HTL 53 preferably has a thickness within the range of, for example, from 30 to 50 nm. This specification, for example, prevents pinholes and changes in the chromaticity (hue) of the color of emitted light, thereby enabling a higher external quantum efficiency.

The present embodiment achieves effects that are similar to Embodiment 1.

Variation Example 1

Note that although Embodiments 1 and 2 above discussed examples where the light-emitting element ES is a QLED, the present embodiment is not limited to these examples. The light-emitting element ES, for example, an organic light-emitting diode, may be referred to as the organic EL (electroluminescence) element. In addition, an inorganic light-emitting diode may be referred to as an inorganic EL element.

When the light-emitting element ES is an OLED or an inorganic light-emitting diode, the EML 54 is made of, for example, an organic light-emitting material such as a low-molecular fluorescent (or phosphorescent) pigment or a metal complex or an inorganic light-emitting material.

When the light-emitting element ES is an OLED or an inorganic light-emitting diode, holes and electrons recombine in the EML 54 under the drive current flowing between the anode 51 and the cathode 56, which generates excitons that emit light when transitioning to the ground state.

When the light-emitting element ES is an OLED or an inorganic light-emitting diode, the EML 54 may be formed by, for example, vacuum vapor deposition, sputtering, or inkjet printing.

Variation Example 2

In addition, FIG. 1 shows, as an example, the ETLs 55 being separated insularly for each subpixel SP by the bank BK covering the edge of the anode 51. However, the display device 1 is not necessarily limited to this structure. The functional layers other than the EML 54 may be formed, for example, as common layers that are common to the subpixels SP.

Variation Example 3

In addition, Embodiments 1 and 2, as shown in FIG. 2 or 6, discussed examples where the ETL 55 is provided as a functional layer between the cathode 56 and the EML 54. However, the functional layer needs only to include the EML 54 and further include either the HTL 53 or the HIL 52 and the HTL 53 as a hole-transportable functional layer between the anode 51 and the EML 54. Therefore, the-light-emitting element ES does not necessarily include the ETL 55. In addition, there may be provided an electron injection layer (EIL) between the cathode 56 and the ETL 55. In addition, any other functional layers may be further provided between the hole-transportable functional layer and the cathode 56.

Variation Example 4

In addition, Embodiments 1 and 2 discussed examples where the display device 1 includes, as subpixels, subpixels RSP, subpixels GSP, and subpixels BSP. This combination is however not essential.

Variation Example 5

In addition, Embodiment 1 discussed an example where the light-emitting device is a display device. The light-emitting element ES is especially suitably used as a light source for the display device 1. However, the light-emitting device in accordance with the present disclosure is not necessarily limited to a display device. The light-emitting element ES may be used alternatively as a light source for a light-emitting device other than a display device.

Variation Example 6

In addition, the HIL 52 in Embodiment 1 and the HTL 53 in Embodiment 2 may be either the same or different in the light-emitting element RES, the light-emitting element GES, and the light-emitting element BES, if the HIL 52 in Embodiment 1 and the HTL 53 in Embodiment 2 have a uniform layer thickness across the light-emitting elements ES, as described above.

Generally, if the electron mobility and the hole mobility differ significantly in display devices, the luminous efficiency decreases.

The conduction band energy level of a QD (equal to the electron affinity) varies depending on the wavelength of the light emitted by the QD. In particular, the conduction band energy level of a QD has a deeper energy level as the QD emits light with a longer wavelength and a shallower energy level as the QD emits light with a shorter wavelength.

Therefore, for example, when the material and layer thickness of the ETL 55 are the same, the electronic barrier from the ETL 55 to the EML 54 grows larger in the order of the light-emitting element RES<the light-emitting element GES<the light-emitting element BES. Therefore, the electron injection amount grows larger in the order of the light-emitting element BES<the light-emitting element GES<the light-emitting element RES.

Therefore, to strike a charge-carrier balance between holes and electrons, the hole injection amount needs only to grow larger in the order of the light-emitting element BES<the light-emitting element GES<the light-emitting element RES.

Therefore, in the display device 1, the layer thickness of at least one of the HIL 52 and the HTL 53 may be varied among the light-emitting element RES, the light-emitting element GES, and the light-emitting element BES so that the hole injection amount can grow larger in the order of the light-emitting element BES<the light-emitting element GES<the light-emitting element RES.

In addition, according to the present disclosure, the hole transportability varies with the PVP blending ratio relative to PEDOT:PSS. Therefore, according to the present disclosure, the PVP content per unit part by weight of PSS in the first functional layer may be varied within the aforementioned range among the light-emitting element RES, the light-emitting element GES, and the light-emitting element BES so that the hole injection amount can grow larger in the order of the light-emitting element BES<the light-emitting element GES<the light-emitting element RES. Note that within the aforementioned range, the external quantum efficiency improves as the PVP content per unit part by weight of PSS increases. Therefore, the PVP blending ratio relative to PEDOT:PSS may be varied within the aforementioned range so that the PVP content per unit part by weight of PSS in the first functional layer can grow larger in the order of the light-emitting element BES<the light-emitting element GES<the light-emitting element RES.

The present disclosure is not limited to the description of the embodiments above and may be altered within the scope of the claims. Embodiments based on a proper combination of technical means disclosed in different embodiments are encompassed in the technical scope of the present disclosure. Furthermore, new technological features can be created by combining different technical means disclosed in the embodiments.

The invention claimed is:

1. A light-emitting element comprising:
an anode;
a cathode;
a light-emitting layer between the anode and the cathode; and
a hole-transportable, first functional layer in contact with the anode between the anode and the light-emitting layer, wherein
the anode contains a metal oxide,
the first functional layer contains polyvinylpyrrolidone and a composite of poly(3,4-ethylenedioxythiophene) and poly(4-styrene sulfonate), and
the first functional layer contains the polyvinylpyrrolidone in an amount of from 0.16 parts by weight inclusive to 1.5 parts by weight exclusive per unit part by weight of the poly(4-styrene sulfonate).

2. The light-emitting element according to claim 1, wherein the first functional layer contains the polyvinylpyrrolidone in an amount of from 0.3 parts by weight to 0.7 parts by weight, both inclusive, per unit part by weight of the poly(4-styrene sulfonate).

3. The light-emitting element according to claim 1, wherein the metal oxide contains indium.

4. The light-emitting element according to claim 3, wherein the metal oxide is ITO or IZO.

5. The light-emitting element according to claim 1, wherein the first functional layer is a hole injection layer, the light-emitting element further comprising a hole transport layer between the hole injection layer and the light-emitting layer.

6. The light-emitting element according to claim 1, wherein the first functional layer is a hole transport layer.

7. A light-emitting device comprising the light-emitting element according to claim 1.

8. A method of manufacturing a light-emitting element including: an anode; a cathode; a light-emitting layer between the anode and the cathode; and a hole-transportable, first functional layer in contact with the anode between the anode and the light-emitting layer, wherein the anode contains a metal oxide, the method comprising:

preparing an aqueous solution obtained by mixing polyvinylpyrrolidone and a composite of poly(3,4-ethylenedioxythiophene) and poly(4-styrene sulfonate) such that the polyvinylpyrrolidone is present in an amount of from 0.16 parts by weight inclusive to 1.5 parts by weight exclusive per unit part by weight of the poly (4-styrene sulfonate); and forming the first functional layer by applying the aqueous solution onto the anode and thereafter drying the aqueous solution.

9. The method according to claim 8, wherein in preparing the aqueous solution, the polyvinylpyrrolidone and the composite of the poly(3,4-ethylenedioxythiophene) and the poly (4-styrene sulfonate) are mixed such that the polyvinylpyrrolidone is present in an amount of from 0.3 parts by weight to 0.7 parts by weight, both inclusive, per unit part by weight of the poly(4-styrene sulfonate).

* * * * *